US005164970A

United States Patent [19]

Shin et al.

[11] Patent Number: 5,164,970

[45] Date of Patent: Nov. 17, 1992

[54] CASCADED DRIVER CIRCUIT

[75] Inventors: Yasuhiro Shin; Teruyuki Fujii, both of Tokyo, Japan

[73] Assignee: OKI Electric Industry Co., Ltd., Tokyo, Japan

[21] Appl. No.: 627,408

[22] Filed: Dec. 14, 1990

[30] Foreign Application Priority Data

Dec. 15, 1989 [JP] Japan ........................ 1-326580

[51] Int. Cl.$^5$ ........................ G11C 19/00; G09G 3/00; H03K 21/08

[52] U.S. Cl. ........................ 377/54; 377/56; 377/76; 377/80; 377/119; 307/269; 328/63; 340/811

[58] Field of Search ........................ 377/56, 119, 54, 55, 377/47, 49, 50, 70, 75, 77, 78; 328/72, 63, 129.1; 307/269, 480; 340/800, 802, 805, 811, 814, 798; 359/85

[56] References Cited

U.S. PATENT DOCUMENTS 4,285,847 10/1980 Masuda et al. ........................ 340/802
4,393,301 7/1983 Svendsen ........................ 377/56
4,500,880 2/1985 Gomersall et al. ........................ 340/802
4,538,145 8/1985 Mitani et al. ........................ 340/805
4,967,192 10/1990 Hirane et al. ........................ 340/811
5,017,914 5/1991 Uchida et al. ........................ 340/811
5,021,775 6/1991 Babin ........................ 340/814

FOREIGN PATENT DOCUMENTS 0244978 4/1987 European Pat. Off. .
2135099 1/1984 United Kingdom .
2188183 3/1987 United Kingdom .

*Primary Examiner*—Janice A. Howell
*Assistant Examiner*—Tai V. Duong
*Attorney, Agent, or Firm*—Edward D. Manzo

[57] ABSTRACT

A cascaded driver circuit has two or more stages connected to a common serial data signal line and a common clock pulse signal line. Each stage has a counter circuit for dividing the frequency of the clock pulse signal and an enable latch circuit for latching an enable signal, received from the preceding stage, in response to the divided clock pulses. A data latching circuit in each stage latches serial data in response to the clock pulse signal, starting when the enable signal is latched and stopping when a first number of bits of serial data have been latched. An enable output circuit in each stage sends an enable signal to the next stage when the data latching circuit has latched a second number of bits, the second number being at least two less than the first number.

19 Claims, 6 Drawing Sheets

CASCADED DRIVER CIRCUIT

BACKGROUND OF THE INVENTION

This invention relates to a driver circuit for a device such as a liquid crystal display (LCD), more particularly to a driver circuit suited for high-speed cascaded operation.

Driver circuits for large LCDs must provide parallel output on numerous signal lines, such as 640 signal lines or more. This far exceeds the output pin count of even a large integrated circuit (IC), so it is common for several driver ICs to be interconneted in cascade. For example, eight ICs with 80 output pins each, or four ICs of the tape-automated bonding (TAB) type with 160 output pins each, can be cascaded to drive 640 signal lines.

In such a cascaded configuration the input data are provided in serial form to all the driver ICs in common. Each IC also receives an enable signal from the preceding IC in the cascade. The ICs latch the serial input data in turn: the first-stage IC latches the first N bits, the second-stage IC latches the next N bits, and so on. As soon as it finishes latching its own N bits of data, each IC must promptly assert its enable signal so that the next-stage IC can begin latching the next N bits.

To assert the enable signal, an IC must generate the enable signal internally and output it on an external signal line. The enable signal must then be received, amplified and stored in a latch in the next-stage IC. These processes take a certain amount of time, due to internal gate and amplifier propagation delays, the propagation delay on the external signal line, and the need to satisfy latch setup requirements.

A problem is that these processes must be completed within one clock cycle: for example, the clock cycle during which the first-stage IC latches the N-th bit. Consequently, the following condition must be satisfied:

clock cycle time ≧ enable delay time + enable setup time

If the ICs are fabricated by CMOS technology with 4-micron design rules, the enable delay time is substantially 170 ns while the setup time is substantially 40 ns, so the clock cycle can be no shorter than substantially 210 ns and the clock rate no faster than substantially 4.76 MHz.

This speed is unsatisfactory: in many applications it would be desirable to transfer 64,000-bit data 80 times per second, requiring a 5.12-MHz clock, and future high-resolution LCDs will require even faster clock rates. The delay and setup requirements of the enable signal in a cascade configuration are the chief obstacle to the attainment of such rates.

SUMMARY OF THE INVENTION

It is accordingly an object of the present invention to permit driver-circuit stages to be cascaded without causing the clock rate to be limited by the enable signal sent from one stage to the next.

In a cascaded driver circuit having two or more stages connected to a common serial data signal line and a common clock pulse signal line, each stage comprises:

- a counter circuit for dividing the clock pulse signal in frequency;

- an enable latch circuit for latching an enable signal, received from the preceding stage, in response to the divided clock pulse signal;
- a data latching means for latching serial data in response to the clock pulse signal, starting when the enable latch circuit latches the enable signal and stopping when a first number of bits of serial data have been latched; and
- an enable output circuit for sending an enable signal to the next stage when the data latching means has latched a second number of bits of serial data, the second number of bits being at least two less than the first number of bits.

DETAILED DESCRIPTION OF THE INVENTION

A driver circuit embodying the present invention will be described with reference to FIGS. 1A, 1B, and 2, after which a variation will be described with reference to FIGS. 3 and 4. These drawings are provided for illustrative purposes and do not restrict the scope of the invention, which should be determined solely from the appended claims.

Figure 1:
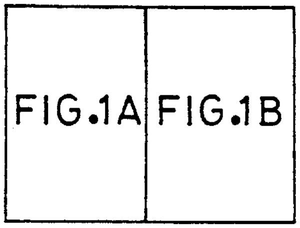
FIGS. 1, 1A and 1B are schematic diagrams illustrating two novel driver circuit stages connected in a cascade configuration.
Figure 1A:
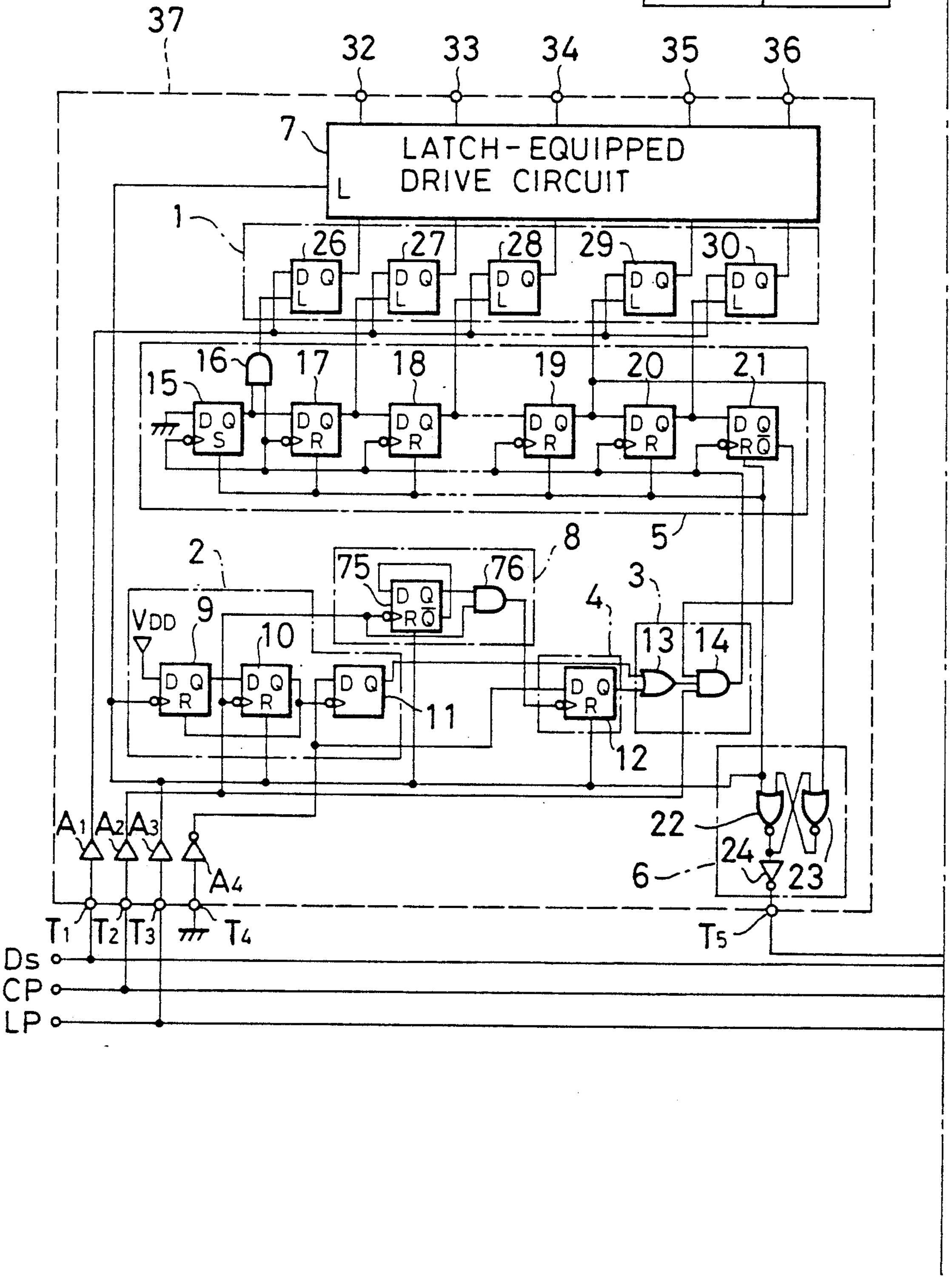
Figure 1B:
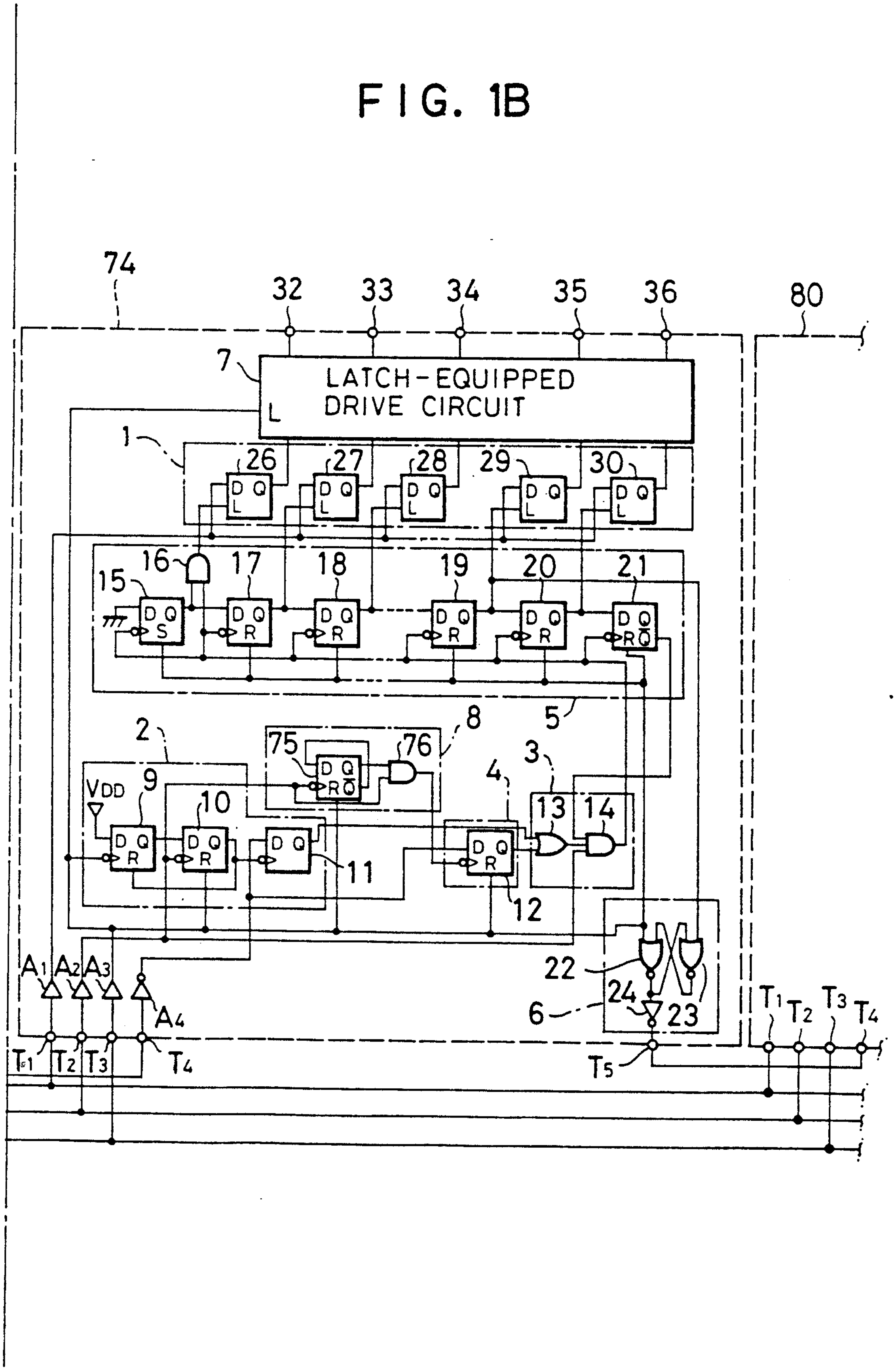

FIGS. 1A and 1B show two identical driver-circuit ICs, a first-stage IC 37 and a second-stage IC 74, connected in common to a serial data (Ds) signal line, a clock pulse (CP) signal line, and a latch pulse (LP) signal line. Serial data, clock pulse, and latch pulse signals are provided on these signal lines by a data generating circuit such as a microprocessor not shown in the drawing.

Each driver-circuit IC has a first terminal $T_1$ for input of the serial data Ds, a second terminal $T_2$ for input of the clock pulse signal CP, a third terminal $T_3$ for input of the latch pulse signal LP, a fourth terminal $T_4$ for input of an enable input signal, and a fifth terminal $T_5$ for output of an enable output signal. The fifth terminal $T_5$ of the first-stage IC 37 is connected to the fourth terminal $T_4$ of the second-stage IC 74, so that the enable output signal of the first-stage IC 37 becomes the enable input signal of the second-stage IC 74. Similarly, the fifth terminal $T_5$ of the second-stage IC 74 is connected to the fourth terminal $T_4$ of a third-stage driver circuit 80. The fourth terminal $T_4$ of the first-stage IC 37 is grounded.

The first through fourth terminals $T_1$ to $T_4$ are connected to respective amplifiers $A_1$ to $A_4$, which amplify the input signals. The amplifier $A_4$ is an inverting amplifier that inverts the enable input signal. The enable input and output signals are accordingly active low, meaning that they are low when asserted and high when deasserted. Except when it is important to distinguish between them, the enable input signal and enable output signal will both be referred to simply as the $\overline{\text{ENABLE}}$ signal. This $\overline{\text{ENABLE}}$ signal is an instance of the enable signal mentioned in the summary of the invention and the appended claims.

Further mention of the amplifiers $A_1$ to $A_4$ will generally be omitted.

Each driver-circuit IC also comprises a data latching circuit 1, a first-stage/next-stage discrimination circuit 2, a clock control circuit 3, an enable latch circuit 4, a shift register 5, an enable output circuit 6, a latch-equipped drive circuit 7, and a counter circuit 8. The data latching circuit 1, the clock control circuit 3, and the shift register 5 form a data latching means as described in the summary of the invention.

The structure and operation of the internal blocks in the ICs will be described individually below, after which the overall operation of the driver circuit will be described. First, however, the operation of a D-type flip-flop circuit, such as the flip-flops 9 to 12, 15, 17 to 21, 75, and 76 in FIGS. 1A and 1B, will be briefly reviewed.

A D-type flip-flop has D (data), S (set), R (reset) and clock input terminals, and Q and $\overline{Q}$ output terminals. A high input at the S terminal sets the flip-flop, making its Q output high and its $\overline{Q}$ output low. A high input at the R terminal resets the flip-flop, making its Q output low and its $\overline{Q}$ output high.

A high-to-low transition at the clock input terminal causes the flip-flop to store the logic level input at its D terminal, output this logic level at its Q terminal, and output the inverse of this logic level at its $\overline{Q}$ terminal. The flip-flop is said to latch the D input in response to the signal input at the clock terminal, or to be clocked by the input at the clock terminal.

In the drawings, the clock input terminal will be indicated by a triangular symbol and the other terminals by the letters D, S, R, Q, and $\overline{Q}$. Terminals which are not connected are omitted from the drawings.

The structure and operation of the counter circuit 8, which is the novel feature of this invention, will now be described.

The counter circuit 8 comprises a T-type flip-flop 75 and an AND gate 76. A T-type flip-flop is a D-type flip-flop in which the $\overline{Q}$ output terminal is connected to the D input terminal, causing the Q and $\overline{Q}$ outputs to toggle on every high-to-low transition at the clock input terminal. The clock input terminal of the T-type flip-flop 75 is connected to the second terminal $T_2$, so that the T-type flip-flop 75 is clocked by the clock pulse signal CP.

The R input terminal of the T-type flip-flop 75 is connected to the third terminal $T_3$, so that the T-type flip-flop 75 is reset by the latch pulse signal LP. The Q output of the T-type flip-flop 75 is connected to one input terminal of the AND gate 76.

The other input terminal of the AND gate 76 is connected to the second terminal $T_2$ and receives the clock pulse signal CP. The output of the AND gate 76 is fed to the enable latch circuit 4.

Figures 2A, 2B:
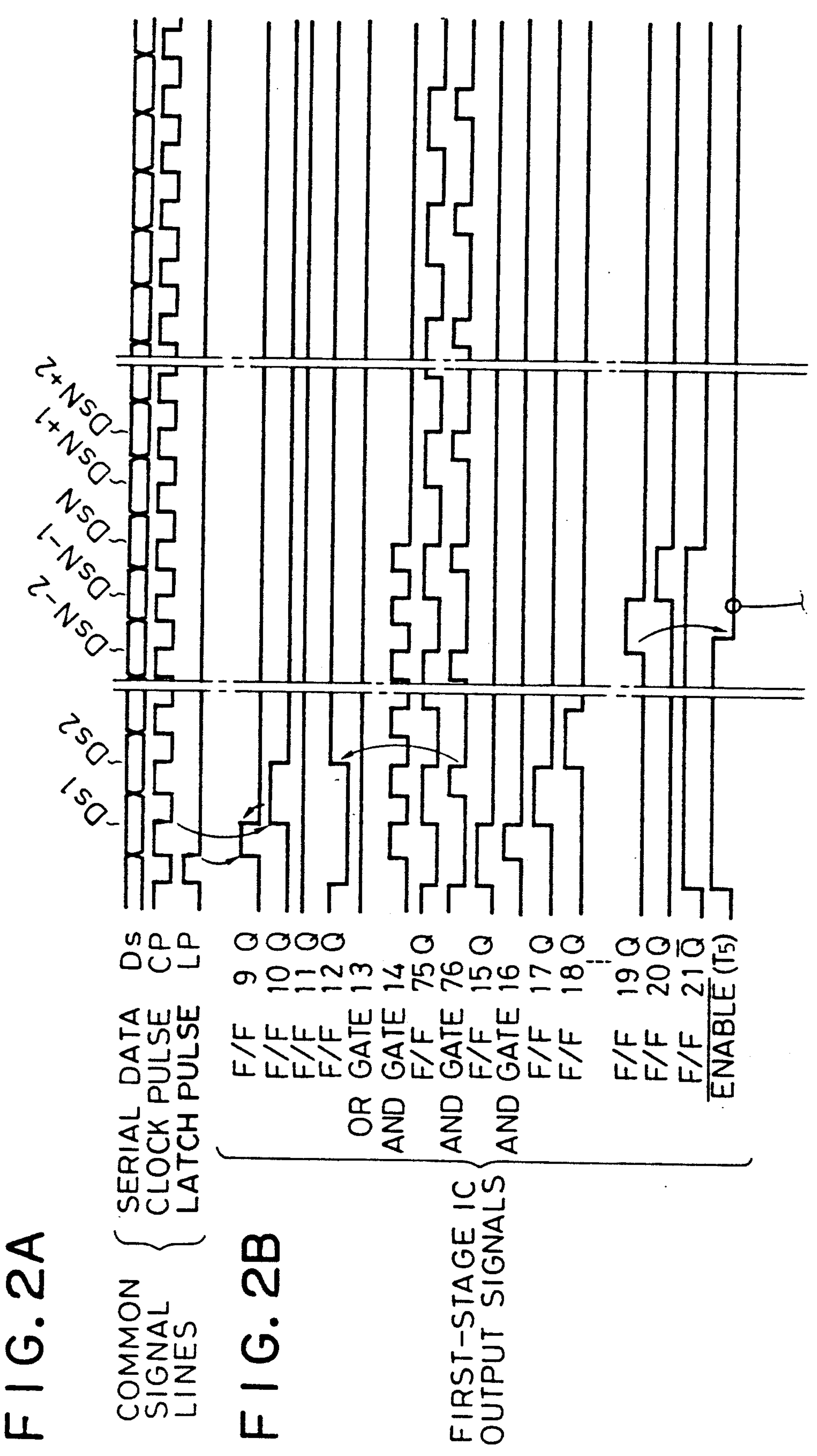
FIGS. 2A, 2B, and 2C are a timing diagram illustrating the operation of the driver circuit in FIGS. 1A and 1B.

The operation of the counter circuit 8 will next be described with reference to FIGS. 2A to 2C. Waveforms of the serial data signal Ds, clock pulse signal CP, and latch pulse signal LP are shown in FIG. 2A. Waveforms output by various flip-flops and gates in the first-stage IC 37 are shown in FIG. 2B, and waveforms output by the same flip-flops and gates in the second-stage IC 74 are shown in FIG. 2C.

With reference to FIG. 2A, the rising edge of the latch pulse signal LP is timed to coincide with the falling edge of the clock pulse signal CP. The latch pulse LP is asserted for only one-half clock cycle, falling at the next rising edge of the clock pulse CP. The first serial data Ds1 is output on the Ds signal line immediately after the latch pulse LP.

Figure 2C:
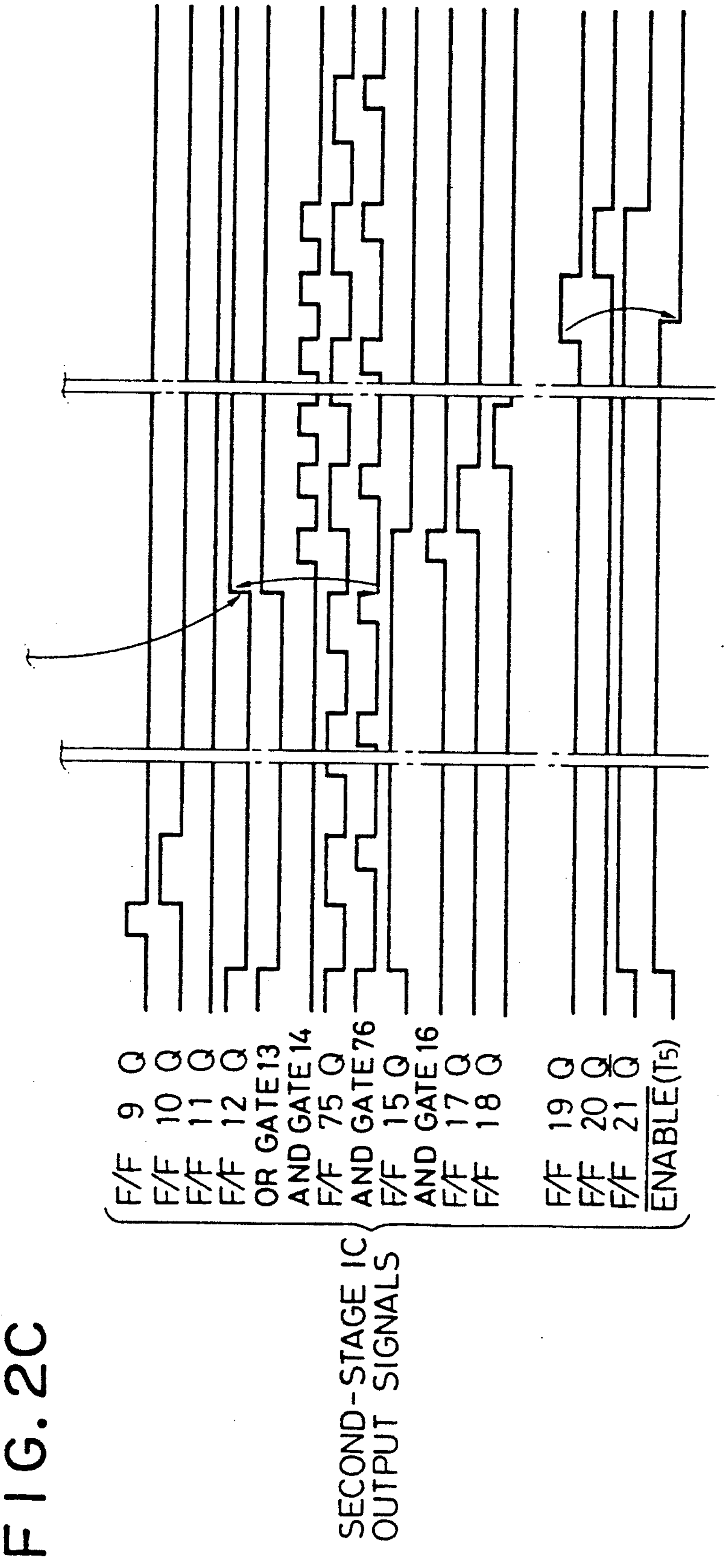

When the latch pulse signal LP goes high in FIG. 2A, the T-type flip-flop 75 in both in FIGS. 2B and 2C is reset and its Q output goes low, hence the output of the AND gate 76 goes low. Thereafter, the Q output of the T-type flip-flop 75 toggles between the high and low states on each falling edge of the clock pulse signal CP. By ANDing the Q output of the T-type flip-flop 75 with the clock pulse CP, the AND gate 76 divides the frequency of the clock pulses CP by a factor of two: the output of the AND gate 76 goes high only during every second high CP pulse.

The output of the AND gate 76 will be referred to below as a divided clock pulse signal. Since the flip-flop 75 is reset by the latch pulse LP, divided clock pulses coincide with the even-numbered serial data Ds2, . . . , DsN-2, DsN, . . . .

Next the structure and operation of the enable latch circuit 4 will be described.

With reference again to FIGS. 1A and 1B, the enable latch circuit 4 comprises a single D-type flip-flop 12, the D input terminal of which receives the $\overline{\text{ENABLE}}$ signal from the fourth terminal $T_4$. The R input terminal of the flip-flop 12 receives the latch pulse signal LP from the third terminal $T_3$. The clock input terminal of the flip-flop 12 receives the divided clock pulse signal from the AND gate 76.

The Q output of the flip-flop 12 is supplied to the clock control circuit 3, and will be referred to as the latched enable signal. Since the $\overline{\text{ENABLE}}$ signal is inverted by the inverting amplifier $A_4$, the latched enable signal is active high.

With reference to FIGS. 2A, 2B, and 2C, when the latch pulse LP is asserted, the flip-flop 12 is reset and its Q output goes low. Thereafter, each time a divided clock pulse is received from the AND gate 76, the flip-flop 12 latches the inverted enable signal received from the fourth terminal $T_4$ via the inverting amplifier $A_4$. In FIG. 2B, since the fourth terminal $T_4$ of the first-stage IC 37 is grounded, the Q output of the flip-flop 12 goes high at the first divided clock pulse and remains high thereafter. In FIG. 2C, the Q output of the flip-flop 12 goes high at the first divided clock pulse after the first-stage IC 37 asserts the $\overline{\text{ENABLE}}$ signal.

Next the structure and operation of the first-stage/next-stage discrimination circuit 2 will be described. The function of the first-stage/next-stage discrimination circuit 2 is to generate a first-stage recognition signal that is asserted (high) if the IC is the first stage in the cascade, and deasserted (low) otherwise.

With reference again to FIGS. 1A and 1B the first-stage/next-stage discrimination circuit 2 comprises three D-type flip-flops 9, 10, and 11. The clock input of the flip-flop 9 and the R input of the flip-flop 10 receive the latch pulse signal LP from the third terminal $T_3$. The D input of the flip-flop 9 is connected to the power supply ($V_{DD}$) and is always high. The Q output of the flip-flop 9 is fed to the D input of the flip-flop 10. The Q output of the flip-flop 10 is fed to the R input of the flip-flop 9 and the clock input of the flip-flop 11. The D input of the flip-flop 11 is connected via the inverting amplifier $A_4$ to the fourth terminal $T_4$ and receives the inverted enable input signal. The Q output of the flip-flop 11 is the above-mentioned first-stage recognition signal.

With reference to FIGS. 2A and 2B, when a latch pulse LP is received at the clock input of the flip-flop 9 and the R input of the flip-flop 10, the Q output of the flip-flop 9 goes high and the Q output of the flip-flop 10 goes (or remains) low. On the first subsequent falling edge of the clock pulse CP, the flip-flop 10 latches the high output of the flip-flop 9 and the Q output of the flip-flop 10 goes high, resetting the flip-flop 9. On the next subsequent falling edge of the clock pulse CP, the flip-flop 10 latches the low output of the flip-flop 9, so the Q output of the flip-flop 10 goes low. This high-to-low transition of the Q output of the flip-flop 10 causes the flip-flop 11 to latch the inverted enable input signal.

From this point onward until the next latch pulse LP, the Q outputs of the flip-flops 9 and 10 both remain low, so there is no further input to the clock terminal of the flip-flop 11, and the Q output of the flip-flop 11 remains unchanged.

In FIG. 2B, since the fourth terminal $T_4$ of the first-stage IC 37 is grounded, the inverted enable input signal is always high. The first-stage recognition signal output by the flip-flop 11 in the first-stage IC 37 is therefore always high, except possibly during the interval from power-on until two clock pulses CP after the first latch pulse LP.

As will be explained later, the enable output signal is always deasserted (goes high) at input of a latch pulse LP and remains high for some time thereafter. For example, the $\overline{\text{ENABLE}}$ signals output from the $T_5$ terminals of the first-and second-stage ICs 37 and 74 in FIGS. 2B and 2C can both be seen to go high when the latch pulse LP is asserted.

The inverted enable input signal latched by the flip-flop 11 in the second-stage IC 74 and higher-stage driver circuits is accordingly low. The first-stage recognition signal output by the flip-flop 11 in the second-stage IC 74 and higher-stage driver circuits is accordingly always low, as shown in FIG. 2C, except possibly during the interval from power-on until two clock pulses CP after the first latch pulse LP.

Next the structure and operation of the shift register 5 will be described.

With reference again to FIGS. 1A and 1B, the shift register 5 comprises N+1 D-type flip-flops, where N is a positive even number, typically a large number such as 80 or 160. In the drawing only six representative flip-flops 15, 17, 18, 19, 20, and 21 are shown.

The D input terminal of the first flip-flop 15 is grounded. The Q output of each flip-flop 15, 17, . . . , 20 is connected to the D input of the next flip-flop 17, 18, . . . , 21. The clock input terminals of all the flip-flops 15, 17, . . . , 21 are connected via three-output AND gate 14 in the clock control circuit 3 to the second terminal $T_2$. The flip-flops 15, 17, . . . , 21 are accordingly clocked by clock pulses CP received from the AND gate 14.

The S input terminal of the first flip-flop 15 and the R input terminals of the second through (N+1)-th flip-flops 17, . . . , 21 receive the latch pulse signal LP from the third terminal $T_3$. The $\overline{Q}$ output of the (N+1)-th flip-flop 21 is supplied to the clock control circuit 3. The Q output of the (N+1)-th flip-flop 21 is not connected.

The function of the shift register 5 is to shift a data latching signal from one flip-flop to the next, thereby generating a sequence of N data latching signals. These N data latching signals are output from the Q output terminals of the first through N-th flip-flops 15, 17, . . . , 20 as explained next.

With reference to FIGS. 2A, 2B, and 2C, when the latch pulse LP goes high, the Q output of the first flip-flop 15 goes high, becoming the first of the N data latching signals, while the Q outputs of the second through N-th flip-flops 17, . . . , 20 all go low. The $\overline{Q}$ output of the (N+1)-th flip-flop 21 goes high. This state continues until the falling edge of the first clock pulse CP received from the AND gate 14 in the clock control circuit 3.

With reference to both FIGS. 2B and 2C, at the falling edge of the first clock pulse CP output from the AND gate 14, the high Q output of the first flip-flop 15 is latched by the second flip-flop 17, causing the Q output of the second flip-flop 17 to go high, becoming the second of the above-mentioned N data latching signals. At the same time, the first flip-flop 15 latches the low (ground) input at its D terminal and its Q output goes low, terminating the first data latching signal.

On the falling edge of the next clock pulse CP output from the AND gate 14, the third flip-flop 18 latches the high Q output of the second flip-flop 17 and the second flip-flop 17 latches the low Q output of the first flip-flop 15. As a result, the data latching signal is shifted from the second flip-flop 17 to the third flip-flop 18. Operation continues in this way, the data latching signal being shifted from one flip-flop to the next at each clock pulse CP, until N data latching signals have been generated.

At this point, the data latching signal is shifted from the N-th flip-flop 20 to the (N+1)-th flip-flop 21. No (N+1)-th data latching signal is output, but the $\overline{Q}$ output of the (N+1)-th flip-flop 20 goes low.

As illustrated in FIG. 2C, considerable time may elapse between the latch pulse LP and the first clock pulse CP received from the AND gate 14. To prevent the first data latching signal from remaining high for an unduly long time, the data latching signal output by the first flip-flop 15 is gated by a two-input AND gate 16, shown in FIGS. 1A and 1B. One input terminal of the AND gate 16 receives the Q output of the first flip-flop 15, while the other input terminal receives the clock pulse signal CP output from the AND gate 14. The output of the AND gate 16 is high only when both these inputs are high; that is, only during the high interval of the first clock pulse CP received from the AND gate 14, as indicated in FIG. 2B and 2C.

Next, the structure and operation of the clock control circuit 3 will be described.

With reference again to FIGS. 1A and 1B, the clock control circuit 3 comprises a two-input OR gate 13 and the three-input AND gate 14. The input terminals of the OR gate 13 are connected to the Q output terminals of the flip-flops 11 and 12, so the OR gate 13 generates an output signal that is high if the first-stage recognition signal or the latched enable signal is asserted (high), and low otherwise. The signal output by the OR gate 13 is fed to the second input terminal of the three-input AND gate 14.

The first input terminal of the three-input AND gate 14 receives the $\overline{Q}$ output of the (N+1)-th flip-flop 21 in the shift register 5. The third input terminal of the three-input AND gate 14 receives the clock pulse signal CP from the second terminal $T_2$. The output of the three-input AND gate 14 is connected to the clock input terminals of the flip-flops 15, 17, . . . , 21 in the shift register 5, and to one input terminal of the AND gate 16, as described earlier.

When the inputs at the first and second input terminals of the three-input AND gate 14 are both high, clock pulses CP are passed from the second terminal $T_2$ through the three-input AND gate 14 to the shift register 5. When the input at either the first or second input terminal of the three-input AND gate 14 goes low, output of clock pulses CP to the shift register 5 stops.

Next the structure and operation of the data latching circuit 1 will be described.

The data latching circuit 1 comprises N D-type flip-flops 26, 27, . . . , 30 that have L (latch) input terminals instead of clock input terminals. The flip-flops 26, 27, . . . , 30 latch the inputs at their D terminals during the interval when their L input is high, retaining the latched value thereafter.

The D input teminals of the flip-flops 26, 27, . . . , 30 receive the serial data signal Ds from the first terminal $T_1$. The L input terminals receive the N data latching signals generated by the AND gate 16 and the corresponding flip-flops 17, . . . , 20 in the shift register 5. When it receives a high data latching signal, each flip-flop 26, 27, . . . , 30 latches the serial data currently present on the Ds signal line. After all N data latching signals have been received, the flip-flops 26, 27, . . . , 30 hold N successive bits of serial data Ds, output of which is provided in parallel to the latch-equipped drive circuit 7.

Data latches (D-type latches) may be used instead of the D-type flip-flops 26, 27, . . . , 30. In this case the AND gate 16 is unnecessary.

Next the structure and operation of the latch-equipped drive circuit 7 will be described.

The latch-equipped drive circuit 7 receives the outputs of the flip-flops 26, . . . , 30 in the data latching circuit 1 as described above, and has an L (latch) input terminal connected to the third terminal $T_3$. When a latch pulse LP is received at the third terminal $T_3$, the latch-equipped drive data latching circuit 1 all at once, and commences parallel output of N corresponding drive signals to N output terminals 32, 33, . . . , 36 of the drive-circuit IC.

Next the structure and operation of the enable output circuit 6 will be described.

The enable output circuit 6 comprises a pair of NOR gates 22 and 23 and an inverter 24. The NOR gate 22 receives the latch pulse signal LP from the third terminal $T_3$ and the output of the NOR gate 23, and performs a logical NOR operation thereupon. The NOR gate 23 receives the output of the NOR gate 22 and the data latching signal output from the (N−1)-th flip-flop 19 in the shift register 5, and performs a logical NOR operation thereupon. The output of the NOR gate 22 is inverted by the inverter 24 and output at the fifth terminal $T_5$ as the $\overline{\text{ENABLE}}$ signal.

The NOR gates 22 and 23 form an S-R flip-flop that is set by the data latching signal outut from the (N−1)-th flip-flop 19 and reset by the latch pulse signal LP. The theory operation of the S-R flip-flop is well known, so a thorough description will not be given here. Suffice it to say that a high latch pulse LP, which resets the (N−1)-th flip-flop 19, results in low output from the NOR gate 22, high output from the NOR gate 23, and high output from the inverter 24. Thus when the latch pulse LP is asserted, the enable output circuit 6 deasserts the $\overline{\text{ENABLE}}$ signal.

The $\overline{\text{ENABLE}}$ signal remains deasserted even after the latch pulse LP falls, until the data latching signal in the shift register 5 is shifted into the (N−1)-th flip-flop 19, making the Q output of the (N−1)-th flip-flop 19 go high. Then the output of the NOR gate 23 goes low, the output of the NOR gate 22 goes high, and the output of the inverter 24 goes low, asserting the $\overline{\text{ENABLE}}$ signal and sending it to the next stage.

Next the overall operation of the cascaded driver circuit will be described.

When power is first switched on, the data generating circuit begins sending clock pulses CP to the second terminal $T_2$ of all the driver circuits. Clock pulses CP continue to be sent until power is switched off.

To initialize the first-stage/next-stage discrimination circuits 2, shortly after power is switched on and before any serial data are sent, the data generating circuit outputs a latch pulse LP. As already explained, this causes the first-stage recognition signal (the Q output of the flip-flop 11) to go high in the first-stage IC 37, and low in the second-stage IC 74 and higher-stage ICs, these high and low outputs remaining unchanged thereafter.

With reference to FIG. 2A, the data generating circuit now begins sending serial data. First it sends a latch pulse LP, then it sends bits of serial data Ds1, Ds2, . . . , DsN−1, DsN, DsN+1, . . . corresponding, for example, to one dot line on an LCD display.

With reference to FIGS. 2B and 2C, the latch pulse LP deasserts all the $\overline{\text{ENABLE}}$ signals and resets the flip-flops 12, so that the latched enable signals are also deasserted.

With reference to FIG. 2C, in the second-stage IC 74 and higher-stage ICs, the first-stage recognition signal output from the flip-flop 11 is also deasserted, so both inputs to the OR gate 13 are low and its output is low. Since this low output is the second input of the three-input AND gate 14, no clock pulses CP are output from the three-input AND gate 14 for the time being.

With reference to FIG. 2B, in the first-stage IC 37 the first-stage recognition signal output from of the flip-flop 11 is high, so the output of the OR gate 13 is high and the second input to the three-input AND gate 14 is high. The first input to the three-input AND gate 14 is also high, because the latch pulse LP has reset the flip-flop 21. Accordingly, as soon as the latch pulse LP is asserted, the three-input AND gate 14 in the first-stage IC 37 begins passing clock pulses CP to the shift register 5.

These clock pulses cause the flip-flops 15, 17, . . . , 20 in the shift register 5 to generate a sequence of N data latching signals. The flip-flops 26, 27, . . . , 30 in the data latching circuit 1 in the first-stage IC 37 therefore latch the first N bits of serial data Ds1, Ds2, . . . , DsN. (The number N is the first number mentioned in the summary of the invention.)

When N−2 bits of serial data have been latched, the data latching signal is shifted into the (N−1)-th flip-flop 19, making its Q output go high. This causes the enable output circuit 6 in the first-stage IC 37 to assert the $\overline{\text{ENABLE}}$ signal. (The number N−2 is the second number mentioned in the summary of the invention.)

Two CP clock pulses later, when N bits of serial data have been latched, the data latching signal is shifted into the (N+1)-th flip-flop 21, making its $\overline{Q}$ output go low. This holds the output of the three-input AND gate 14 low, so that no more clock pulses CP reach the shift register 5.

At the very instant that clock pulses stop reaching the shift register 5 in the first-stage IC 37, however, a divided clock pulse output by the AND gate 76 in the second-stage IC 74, indicated by an arrow in FIG. 2C, causes the flip-flop 12 in the second-stage IC 74 to latch the inverted $\overline{\text{ENABLE}}$ signal received from the first-stage IC 37. The output of the OR gate 13 in the second-stage IC 74 accordingly goes high, and the $\overline{Q}$ output of the flip-flop 21 in the second-stage IC 74 is already high, so the three-input AND gate 14 in the second-stage IC 74 starts allowing clock pulses CP to pass to the shift register 5.

The next N bits of serial data DsN+1, , DsN+2, . . . are now latched in the second-stage IC 74 in the same way as the first N bits were latched in the first-stage IC 37. The operation continues in like manner down the cascade, until an entire line of serial data has been latched.

When the next latch pulse LP is received, the data held in the data latching circuits 1 in the driver-circuit ICs are moved all at once into the latch-equipped drive circuits 7, which commence output of corresponding drive signals. This frees the data latching circuits 1 to receive the next line of serial data.

Since there is an interval of two clock pulses CP (one divided clock pulse) between the time at which generation of the $\overline{ENABLE}$ signal begins in one stage and latching of this signal takes place in the next stage, if the enable delay and setup times are substantially 170 ns and 40 ns as mentioned in the background discussion, the condition for successful operation becomes:

two CP clock cycles ≧210 ns

Operation at the desired clock rate of 5.12 MHz is easily possible, because at this rate two CP clock cycles are equal to substantially 391 ns. Indeed, clock rates as high as substantially 9.52 MHz are theoretically possible.

Next a second novel driver circuit will be described with reference to FIGS. 3 and 4. This driver circuit is similar to the one in FIGS. 1A and 1B except for the structure of the counter circuit 8 and the interconnection between the shift register 5 and the enable output circuit 6. Only the differing parts are shown in FIG. 3.

Figure 3:
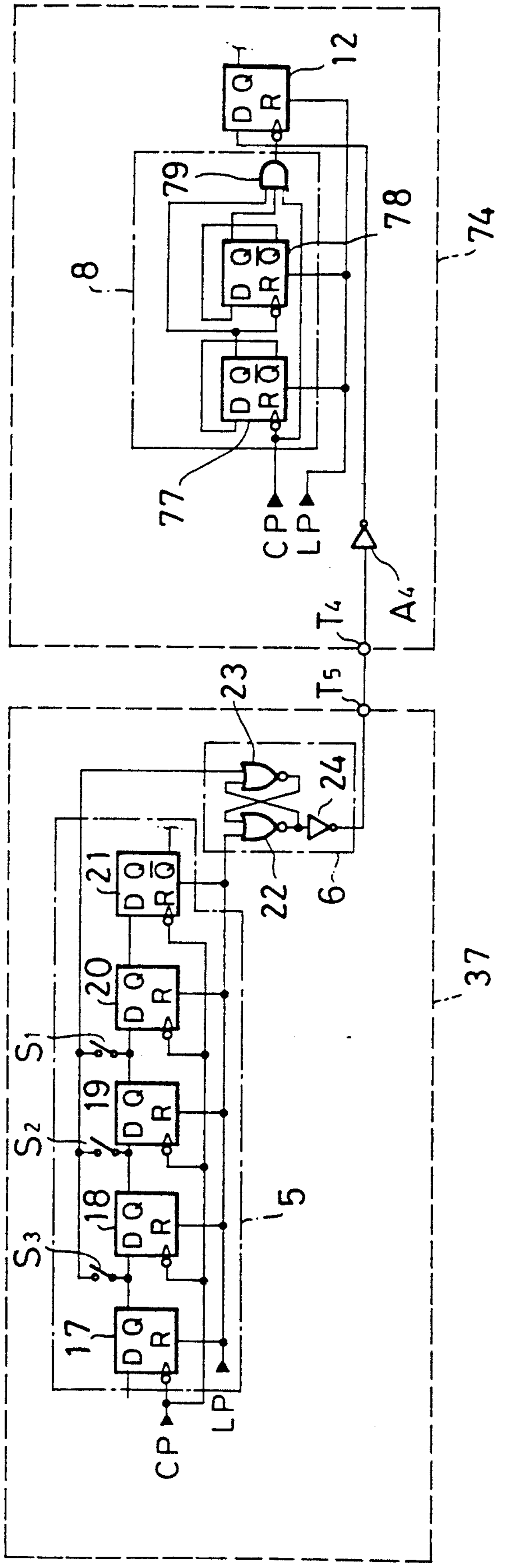
FIG. 3 is a schematic diagram illustrating parts of another novel driver circuit.

With reference to FIG. 3, the counter circuit 8 now comprises a first T-type flip-flop 77, a second T-type flip-flop 78, and a three-input AND gate 79. The first and second T-type flip-flops 77 and 78 are both reset by the latch pulse signal LP. The first T-type flip-flop 77 is clocked by the clock pulse signal CP. The second T-type flip-flop 78 is clocked by the Q output of the first T-type flip-flop 77.

The three-input AND gate 79 receives the Q output of the first T-type flip-flop 77 at its first input terminal, the Q output of the second T-type flip-flop 78 at its second input terminal, and the clock pulse signal CP at its third input terminal. With reference to FIG. 4, the first T-type flip-flop 77 divides the frequency of the clock pulse signal CP by two, then the second T-type flip-flop 78 divides the frequency of the Q output of the first T-type flip-flop 77 by two again. By ANDing the clock pulse signal CP with the Q outputs of the first and second T-type flip-flops 77 and 78, the three-input AND gate 79 divides the frequency of the clock pulse signal CP by a factor of four.

This allows the enable delay and setup time to be equal to a maximum of four CP clock cycles. The optimum interval between the generation and latching of the $\overline{ENABLE}$ signal may depend on the clock rate, so switches are provided to enable this interval to be selected.

With reference again to FIG. 3, the shift register 5 has switches $S_1$, $S_2$, and $S_3$ for selecting the Q output of the (N−3)-th flip-flop, the (N−2)-th flip-flop 18, or the (N−1)-th flip-flop 19. (The (N−3)-th flip-flop is not shown in the drawing.) The selected Q output is connected to an input terminal of the NOR gate 23 in the enable output circuit 6.

Figure 4:
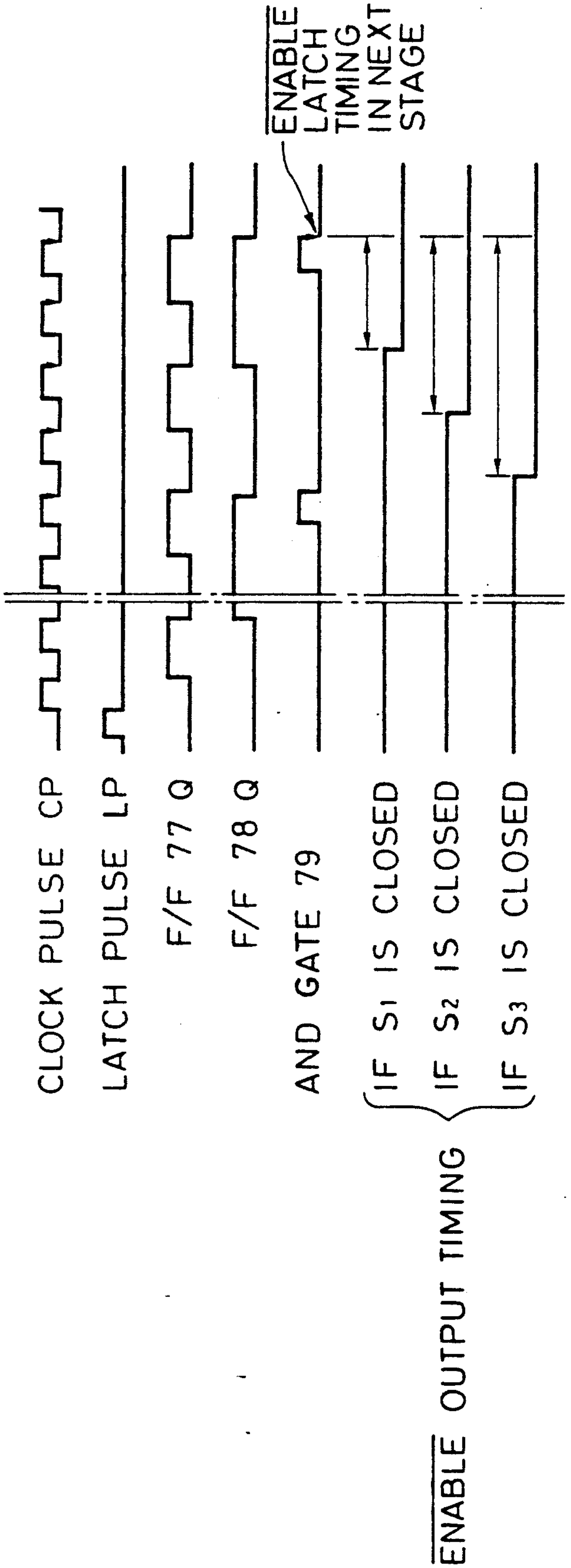
FIG. 4 is a timing diagram illustrating the operation of the driver circuit in FIG. 3.

The output timing of the $\overline{ENABLE}$ signal is illustrated in FIG. 4. If the switch $S_1$ is closed, the $\overline{ENABLE}$ signal is asserted when N−2 bits of serial data have been latched. If the switch $S_2$ is closed, the $\overline{ENABLE}$ signal is asserted when N−3 bits have been latched. If the switch $S_3$ is closed, the $\overline{ENABLE}$ signal is asserted when N−4 bits have been latched.

If 4-micron CMOS circuitry is used, the shift register 5 can operate at clock rates as high as substantially 12 MHz. The novel driver circuit illustrated in FIG. 3 enables such clock rates to be actually employed, so that the full potential of the driver circuit can be realized.

The counter circuit 8 need not be structured exactly as shown in FIGS. 1A and 1B, and 3, and need not divide the frequency of the clock pulses CP by a factor of two or four. The counter circuit 8 can divide the frequency of the clock pulses by any factor D equal to or greater than two. The NOR gate 23 in the enable output circuit 6 should be connected to an (N−E)-th flip-flop in the shift register 5, where 0<E<D. FIGS. 1A and 1B illustrate the case in which D=2 and E=1. FIG. 3 illustrates the case in which D=4 and E is switch-selectable in the range 0<E<4.

Although FIGS. 1A and 1B show a single serial data signal line, actual circuits may have a plurality of serial data signal lines so that plural data bits can be received and latched at once. Each serial data signal line is connected to a separate data latching circuit capable of latching N bits of data. The data latching circuits are all connected in parallel to the shift register 5.

The AND gate 16 is not necessary if edge-triggered flip-flops are used in the data latching circuit 1. The entire data latching means, comprising the data latching circuit 1, the clock control circuit 3, and the shift register 5, may moreover have any circuit configuration capable of latching N bits of serial data, starting when the enable input signal is latched, and of sending an output signal to the enable output circuit when N−E−1 bits have been latched, E being a positive integer and N−E−1 being the second number mentioned in the summary of the invention.

Furthermore, the enable signals may be active high instead of active low and other modifications too numerous to mention, which will be apparent to one skilled in the art, can be made without departing from the spirit and scope of the invention. Applications of the invention are not limited to driving liquid crystal displays. The invention is useful in any situation in which a large number of lines must be driven in parallel by latching serial data.

What is claimed is:

1. A cascaded driver circuit having two or more stages connected in common to a serial data signal line and a clock pulse signal line, each stage comprising;

- a counter circuit for dividing clock pulses received from said clock pulse signal line in frequency, thus generating divided clock pulses;
- an enable latch circuit connected to said counter circuit for latching an enable signal, received from a preceding stage, in response to said divided clock pulses;
- data latching means coupled to said enable latch circuit and said serial data signal line for latching serial data, in response to said clock pulses received from said clock pulse signal line, said data latching means starting to latch the serial data when said enable latch circuit latches said enable signal and stopping when said data latching means has latched a first number of bits of said serial data; and an enable output circuit, connected to said data latching means, for sending an enable signal to a next stage when said data latching means has latched a second number of bits of said serial data, said second number being at least two less than said first number.

2. The circuit of claim 1, wherein said counter circuit divides said clock pulses in frequency by a factor equal to or greater than said first number minus said second number.

3. A cascaded driver circuit having two or more stages connected in common to a serial data signal line, a clock pulse signal line, and a latch pulse signal line, each stage comprising:

a first terminal connected to said serial data signal line, for input of serial data;

a second terminal connected to said clock pulse signal line, for input of a clock pulse signal;

a third terminal connected to said latch pulse signal line, for input of a latch pulse signal;

fourth terminal for input of an enable input signal from a preceding stage;

a fifth terminal for output of an enable output signal to a next stage;

a counter circuit connected to said second terminal, for dividing said clock pulse signal in frequency by a factor of D, where D is an integer greater than or equal to two, thus generating divided clock pulses;

an enable latch circuit, connected to said fourth terminal and said counter circuit, for latching said enable input signal in response to said divided clock pulses;

a shift register comprising N+1 flip-flops connected in series, from a first flip-flop to an (N+1)-th flip-flop, N being a positive integer, for shifting a data latching signal sequentially from said first flip-flop to said (N+1)-th flip-flop according to said clock pulse signal, thereby generating a sequence of N data latching signals as outputs of flip-flops from said first flip-flop through an N-th flip-flop of said shift register;

a data latching circuit comprising N flip-flops connected to said first terminal and said shift register, for latching N bits of said serial data in response to said N data latching signals;

a clock control circuit connected to said second terminal, said shift register, and said enable latch circuit, for passing said clock pulse signal to said shift register from a time when said enable latch circuit latches said enable signal until said data latching signal is shifted from said Nth flip-flop into said (N+1)-th flip-flop in said shift register;

an enable output circuit, connected to said third terminal and said shift register for providing said enable output signal to said fifth terminal, deasserting said enable output signal responsive to said latch pulse signal, and asserting said enable output signal when said data latching signal is shifted into an (N−E)-th flip-flop in said shift register, when E is an integer such that $0<E<D$;

said fifth terminal being connected to the output of said enable output circuit.

4. The circuit of claim 3, wherein D=2, E=1, and N is an even integer.

5. The circuit of claim 4, wherein said counter circuit comprises:

a T-type flip-flop clocked by said clock pulse signal; and an AND gate for ANDing said clock pulse signal with an output of said T-type flip-flop, thus generating said divided clock pulses.

6. The circuit of claim 5, wherein said T-type flip-flop is reset by said latch pulse signal.

7. The circuit of claim 3, wherein D>2, and flip-flops from an (N−D+1)-th flip-flop to an (N−1)-th flip-flop in said shift register have switches for selecting one flip-flop thereamong as said (N−E)-th flip-flop.

8. The circuit of claim 3, wherein D=4 and said counter circuit comprises:

a first T-type flip-flop clocked by said clock pulse signal;

a second T-type flip-flop clocked by an output of said first T-type flip-flop; and an AND gate for ANDing said clock pulse signal with outputs of said first T-type flip-flop and said second T-type flip-flop, thus generating said decimated clock pulses.

9. The circuit of claim 8, wherein said first T-type flip-flop and said second T-type flip-flop are reset by said latch pulse signal.

10. A cascaded driver circuit having two or more stages connected in common to a serial data signal line, a clock pulse signal line, and a latch pulse signal line, each stage comprising:

a first terminal connected to said serial data signal line, for input of serial data;

a second terminal connected to said clock pulse signal line, for input of a clock pulse signal;

a third terminal connected to said latch pulse signal line, for input of a latch pulse signal;

a fourth terminal for input of an enable input signal from a preceding stage;

a fifth terminal for output of an enable output signal to a next stage;

a counter circuit connected to said second terminal, for dividing said clock pulse signal in frequency by a factor of D, where D is an integer greater than or equal to two, thus generating divided clock pulses;

an enable latch circuit connected to said fourth terminal and said counter circuit, for latching said enable input signal in response to said divided clock pulses;

a latch control circuit responsive to said clock pulse signal for producing a sequence of N data latching signals;

a data latching circuit comprising N flip-flops connected to said first terminal and said latch control circuit, for latching N bits of said serial data in response to said N data latching signals;

a clock control circuit connected to said second terminal, said latch control circuit, and said enable latch circuit, for passing said clock pulse signal to said latch control circuit from a time when said enable latch circuit latches said enable signal until said data latching circuit has latched a first number of bits of said serial data;

an enable output circuit, connected to said third terminal, and said latch control circuit, for providing said enable output signal to said fifth terminal, when said data latching circuit has latched a second number of bits of said serial data, said second number being at least two less than said first number;

said fifth terminal being connected to the output of said enable output circuit.

11. The circuit of claim 10 wherein:

said latch control circuit comprises a shift register comprising N+1 flip-flops connected in series, from a first flip-flop to an (N+1)-th flip-flop, N being a positive integer, for shifting a data latching signal sequentially from said first flip-flop to said (N+1)-th flip-flop according to said clock pulse signal, thereby generating a sequence of N data latching signals as outputs of flip-flops from said first flip-flop through an N-th flip-flop of said shift register.

12. The circuit of claim 11 wherein:

said clock control circuit passes said clock pulse signal to said shift register from said time when said enable latch circuit latches said enable signal until said data latching signal is shifted from said N-th flip-flop into said (N+1)-th flip-flop in said shift register.

13. The circuit of claim 12 wherein:

said enable output circuit deasserts said enable output signal responsive to said latch pulse signal, and asserts said enable output signal when said data latching signal is shifted into a (N−E)-th flip-flop in said shift register, where E is an integer such that 0<E<D.

14. The circuit of claim 13, wherein D=2, E=1, and N is an even integer.

15. The circuit of claim 14, wherein said counter circuit comprises:

a T-type flip-flop clocked by said clock pulse signal; and an AND gate for ANDing said clock pulse signal with an output of said T-type flip-flop, thus generating said divided clock pulses.

16. The circuit of claim 15, wherein said T-type flip-flop is reset by said latch pulse signal.

17. The circuit of claim 13, wherein D>2, and flip-flops from an (N−D+1)-th flip-flop to an (N−1)-th flip-flop in said shift register have switches for selecting one flip-flop thereamong as said (N−E)-th flip-flop.

18. The circuit of claim 13, wherein D=4 and said counter circuit comprises:

a first T-type flip-flop clocked by said clock pulse signal;

a second T-type flip-flop clocked by an output of said first T-type flip-flop; and an AND gate for ANDING said clock pulse signal with outputs of said first T-type flip-flop and said second T-type flip-flop, thus generating said divided clock pulses.

19. The circuit of claim 18, wherein said first T-type flip-flop and said second T-type flip-flop are reset by said latch pulse signal.

* * * * *